US010797399B2

(12) United States Patent
Bien et al.

(10) Patent No.: US 10,797,399 B2
(45) Date of Patent: Oct. 6, 2020

(54) WIRELESS POWER TRANSMISSION SYSTEM AND COMMUNICATION SYSTEM

(71) Applicant: Ulsan National Institute of Science and Technology, Ulji-gun (KR)

(72) Inventors: Franklin Don Bien, Ulju-gun (KR); Sai Kiran Oruganti, Ulju-gun (KR); Sang Hyun Heo, Ulju-gun (KR); Woo Jin Park, Ulju-gun (KR); Seok Tae Seo, Ulju-gun (KR); Bon Young Lee, Ulju-gun (KR)

(73) Assignee: Ulsan National Institute of Science and Technology, Ulsan (KR)

( * ) Notice: Subject to any disclaimer, the term of this patent is extended or adjusted under 35 U.S.C. 154(b) by 123 days.

(21) Appl. No.: 16/310,790

(22) PCT Filed: Dec. 29, 2016

(86) PCT No.: PCT/KR2016/015497
§ 371 (c)(1),
(2) Date: Dec. 17, 2018

(87) PCT Pub. No.: WO2017/222133
PCT Pub. Date: Dec. 28, 2017

(65) Prior Publication Data
US 2019/0214734 A1    Jul. 11, 2019

(30) Foreign Application Priority Data

Jun. 20, 2016    (KR) .......................... 10-2016-0076613

(51) Int. Cl.
*H01Q 9/32*    (2006.01)
*H01Q 13/26*   (2006.01)
(Continued)

(52) U.S. Cl.
CPC ................. *H01Q 9/32* (2013.01); *H01Q 9/30* (2013.01); *H01Q 13/26* (2013.01); *H02J 50/20* (2016.02);
(Continued)

(58) Field of Classification Search
CPC .. H01Q 9/30; H01Q 9/32; H01Q 13/26; H02J 50/23; H02J 50/27; H02J 50/50
See application file for complete search history.

(56) References Cited

U.S. PATENT DOCUMENTS

| 2011/0037322 | A1* | 2/2011 | Kanno | .................... | H02J 50/12 |
| | | | | | 307/104 |
| 2014/0103881 | A1 | 4/2014 | Mohammadian et al. | | |
| 2015/0223078 | A1 | 8/2015 | Bennett et al. | | |

FOREIGN PATENT DOCUMENTS

| KR | 10-0660051 B1 | 12/2006 |
| KR | 10-20100013882 A | 2/2010 |

(Continued)

*Primary Examiner* — Hoang V Nguyen
(74) *Attorney, Agent, or Firm* — Thorpe North and Western, LLP; Todd B. Adler

(57) ABSTRACT

A wireless power transmission system and communication system is disclosed. A wireless power transmission system and communication system according to an embodiment of the present invention comprises: a transmission part which includes a first surface wave antenna, installed in a metal wall, for transmitting and receiving an electromagnetic surface wave flowing along a surface of the metal wall, and a first monopole antenna connected to the first surface wave antenna in parallel; and a reception part which includes at least one of a second monopole antenna and a second surface wave antenna, installed in a space partitioned by the metal wall, for receiving an electromagnetic surface wave flowing along the surface of the metal wall.

6 Claims, 10 Drawing Sheets

(51) Int. Cl.
    *H02J 50/50*          (2016.01)
    *H02J 50/20*          (2016.01)
    *H01Q 9/30*           (2006.01)
    *H03H 7/38*           (2006.01)
    *H02J 50/23*          (2016.01)
    *H02J 50/27*          (2016.01)

(52) U.S. Cl.
    CPC .............. *H02J 50/23* (2016.02); *H02J 50/27* (2016.02); *H02J 50/50* (2016.02); *H03H 7/38* (2013.01)

(56) References Cited

FOREIGN PATENT DOCUMENTS

| | | |
|---|---|---|
| KR | 10-20110014642 A | 2/2011 |
| KR | 10-1533155 B1 | 7/2015 |

* cited by examiner

WIRELESS POWER TRANSMISSION SYSTEM AND COMMUNICATION SYSTEM

CROSS-REFERENCE TO RELATED APPLICATIONS

This application is a 371 National Stage Entry of International Application No. PCT/KR2016/015497, filed on Dec. 29, 2016, which claims the benefit of Korean Application No. 10-2016-0076613, filed on Jun. 20, 2016, each of which is incorporated herein by reference

BACKGROUND

Various methods are used to provide a means for communication to users in remote locations as in, for example, a large ship or vessel, a container, and the like. However, it may not be easy to establish wireless communication in a space covered or shield by a metal wall. For example, in the case of a large ship, wired communication may be performed using a buried cable that connects cabins in the large ship. In such a case, a method of forming a hole in a metal wall of a cabin and burying a cable through the hole may be used to build an environment for such wired communication in all cabins of the large ship. However, the method may not be readily performed because burying a cable is not a simple task due to a structure of a cabin, and installing other means for communication is not that simple.

DESCRIPTION OF EMBODIMENTS

Figure 1:
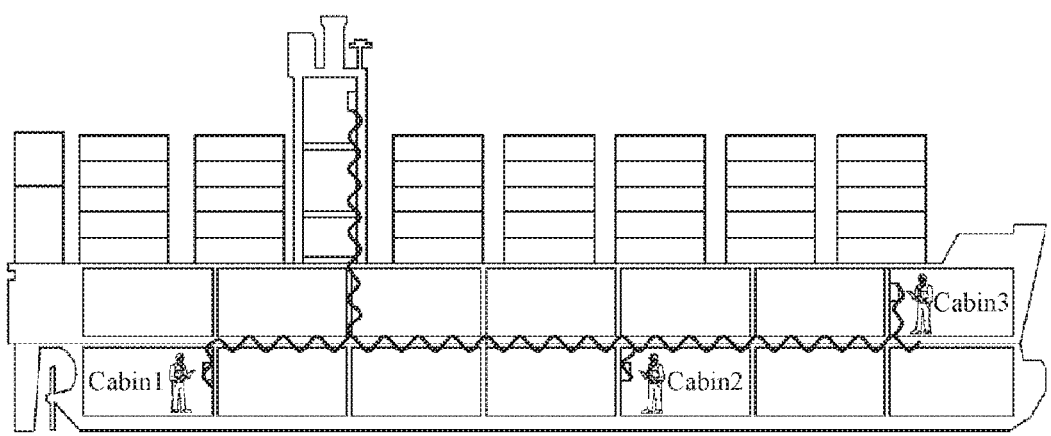
FIG. 1 is a diagram illustrating an example of a structure of a ship to which a wireless power transmission and communication system is applied according to an example embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section.

According to example embodiments described herein, there is provided a wireless power transmission and communication system that may establish an environment for wireless communication between workers in a space closed or shielded by a metal and transmit wireless power to a load positioned in a remote location. More specifically, example embodiments relate to a wireless power transmission and communication system, such as, for example, to a wireless power transmission and communication system using a hybrid antenna of which a surface wave antenna and a monopole antenna are combined.

In one example, the present disclosure provides a wireless power transmission and communication system including a transmitter including a first surface wave antenna installed on a metal wall and configured to transmit and receive an evanescent electromagnetic wave flowing along a surface of the metal wall and a first monopole antenna connected to the first surface wave antenna in parallel, and a receiver including at least one of a second surface wave antenna or a second monopole antenna, which is installed in a space partitioned by the metal wall and configured to receive an evanescent electromagnetic wave flowing along the surface of the metal wall.

The wireless power transmission and communication system may further include a repeater configured to perform relaying between the transmitter and the receiver. The repeater may include a third surface wave antenna configured to transmit and receive an evanescent electromagnetic wave flowing along the surface of the metal wall and a third monopole antenna connected to the third surface wave antenna in parallel.

The evanescent electromagnetic wave may be totally reflected by a convex portion and a concave portion formed on the metal wall on a periodic basis and thereby flow along the surface of the metal wall.

Each of the first surface wave antenna and the second surface wave antenna may include an upper layer provided as a rectangular waveguide of a thin film and having a plurality of perforated rectangular holes therein forming a net shape, a middle layer formed as a dielectric layer under the upper layer with a same thickness as that of the upper layer, and a lower layer formed under the middle layer with a same length, width, and thickness as those of the upper layer, and configured to perform a grounding function.

The wireless power transmission and communication system may further include a power supply configured to supply power to the transmitter, and an impedance matcher. The impedance matcher may measure a voltage reflected from the transmitter and compare a magnitude of the measured voltage to a reference voltage, and perform impedance matching based on a result of the comparing. The power supply may supply, to the transmitter, a voltage obtained through the impedance matching. The power supply may operate in one of a general mode and a fast mode. A magnitude of power to be supplied to the transmitter in the fast mode may be greater than a magnitude of power to be supplied to the transmitter in the general mode.

FIG. 1 is a diagram illustrating an example of a structure of a ship to which a wireless power transmission and communication system is applied according to an example embodiment. According to an example embodiment, a wireless power transmission and communication system may be applied to a ship or vessel as illustrated in FIG. 1. Referring to FIG. 1, a ship includes a plurality of cabins partitioned by metal walls, respectively. In the ship illustrated in FIG. 1, a means for communication between crew members present in cabins 1 through 3 may be provided. Herein, the means for communication, or a communication means, may be the wireless power transmission and communication system described herein.

The wireless power transmission and communication system may include a surface wave antenna configured to transmit and receive power and/or signals through a metal wall. The surface wave antenna may not require a cable connecting a transmitting end and a receiving end, and it is thus possible to remove inconvenience of perforating cabin walls divided by metal walls.

Figure 2:
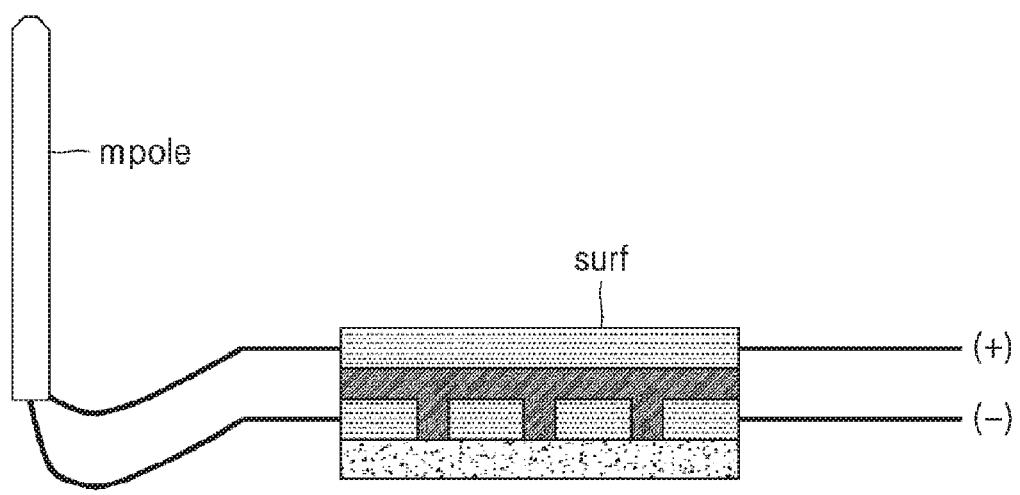
FIG. 2 is a diagram illustrating an example of a configuration of a hybrid antenna according to an example embodiment.

FIG. 2 is a diagram illustrating an example of a configuration of a hybrid antenna according to an example embodiment. Referring to FIG. 2, a hybrid antenna includes a monopole antenna (indicated as "mpole" in the accompanying drawings) and a surface wave antenna (indicated as "surf" in the accompanying drawings). The monopole antenna and the surface wave antenna are connected in parallel to each other. The monopole antenna described herein may be construed as a general-type monopole antenna, and be an antenna configured to resonate when a length of a monopole vertical to an infinite ground surface or a perfect conductor is an approximately ¼ wavelength.

The surface wave may be installed on a metal wall, and configured to transmit an evanescent electromagnetic wave, or an electromagnetic surface wave, that flows along the metal wall or receive an evanescent electromagnetic wave that flows along the metal wall. A detailed structure and operation principle of the surface wave antenna will be described in detail with reference to the accompanying drawings.

Figure 3:
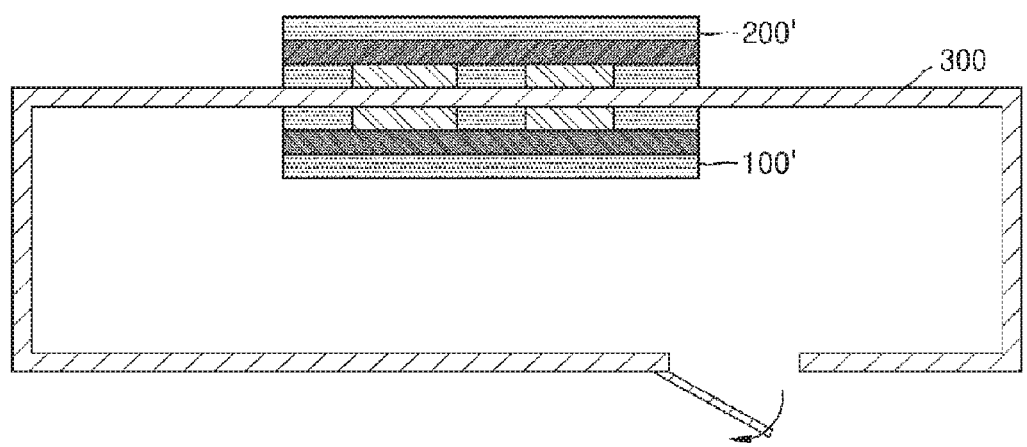
FIG. 3 is a diagram illustrating an example of a configuration of a wireless power transmission and communication system including a surface wave antenna according to an example embodiment.

FIG. 3 is a diagram illustrating an example of a configuration of a wireless power transmission and communication system including a surface wave antenna according to an example embodiment. Referring to FIG. 3, a wireless power transmission and communication system including a surface wave antenna includes a transmitter 100' and a receiver 200'. The transmitter 100' and the receiver 200' may be installed in each of different closed spaces, such as, for example, a control room, an engine room, and a pump room, in a ship, a container, and the like, that have a plurality of such spaces, and may be configured to exchange power or data therebetween.

Each of the transmitter 100' and the receiver 200' may include a surface wave antenna described herein. The surface wave antenna included in the transmitter 100' may be attached to a metal wall 300 and configured to transmit an evanescent electromagnetic wave flowing along the metal wall 300. The surface wave antenna included in the receiver 200' may be attached to the metal wall 300 and configured to receive an evanescent electromagnetic wave flowing along the metal wall 300.

Figure 4:
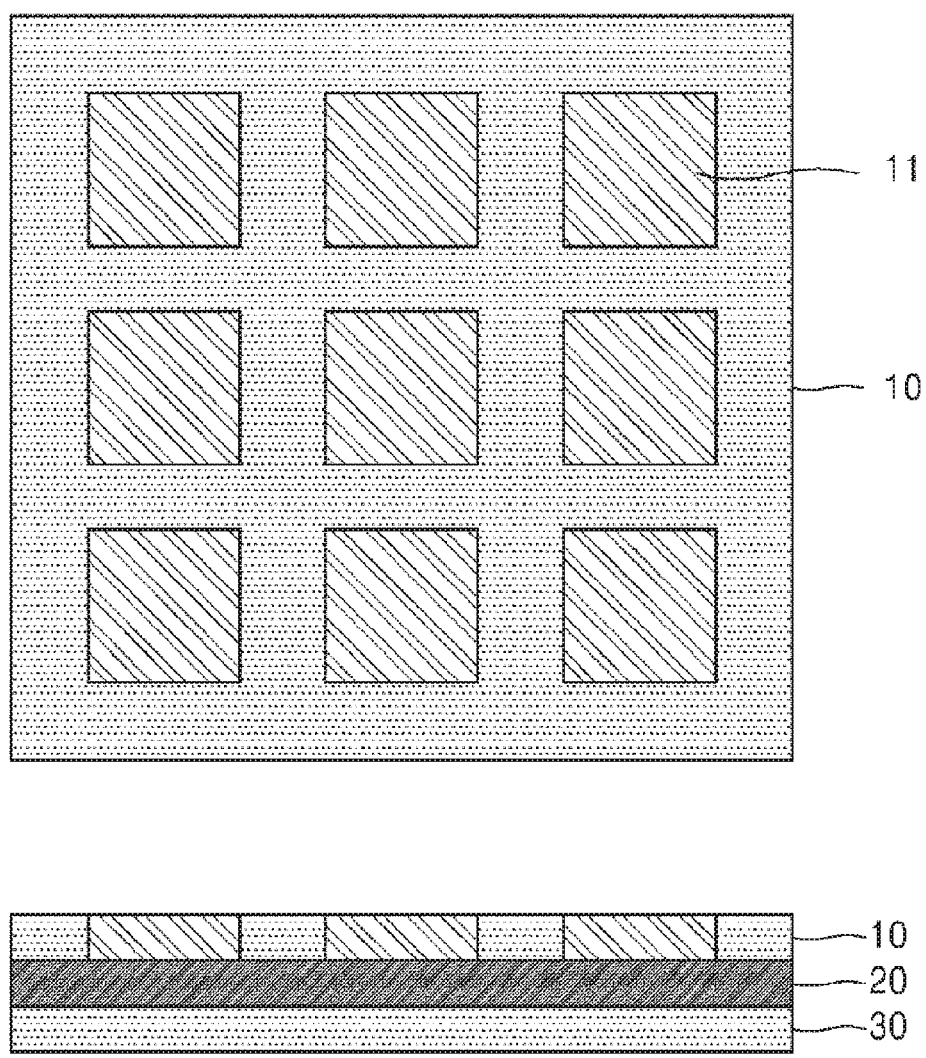
FIG. 4 is a diagram illustrating an example of a structure of a surface wave antenna according to an example embodiment.

FIG. 4 is a diagram illustrating an example of a structure of a surface wave antenna according to an example embodiment. Referring to FIG. 4, a surface wave antenna includes an upper layer 10, a middle layer 20, and a lower layer 30. The upper layer 10 may be provided as a rectangular waveguide of a thin film and have a plurality of perforated rectangular holes 11 therein forming a net shape. The upper layer 10 may be formed with copper, but materials used are not limited to copper, and it may thus be formed with other conductive materials. The middle layer 20 may be a dielectric layer having a same thickness as that of the upper layer 10, and formed with carbon fiber or polycarbonate (PC). The lower layer 30 may have a same length, width, and thickness as those of the upper layer 10, and perform a grounding function.

As described above, the surface wave antenna including the upper layer 10, the middle layer 20, and the lower layer 30 may be installed on a thick metal wall of a closed space in a ship or a container, and configured to generate an evanescent electromagnetic wave having a frequency in a range of 20 megahertz (MHz) to 150 MHz.

Figure 5:
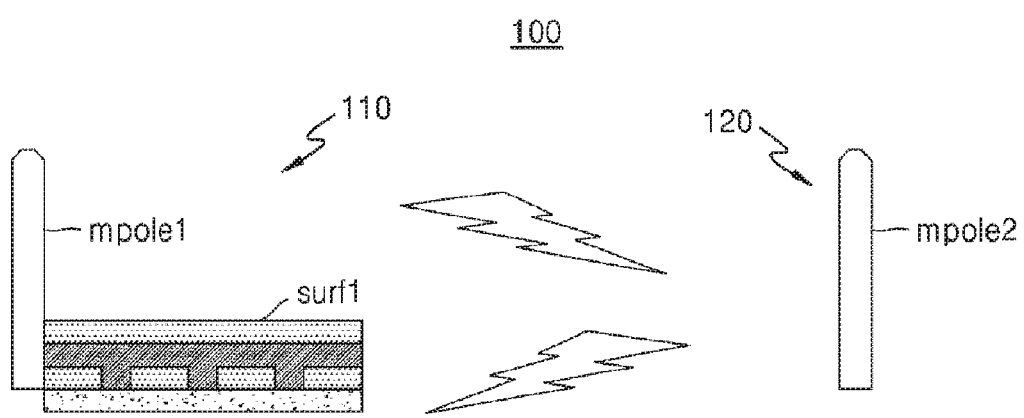
FIGS. 5 through 7 are diagrams illustrating examples of configurations of a transmitter and a receiver of a wireless power transmission and communication system according to an example embodiment.
Figure 6:
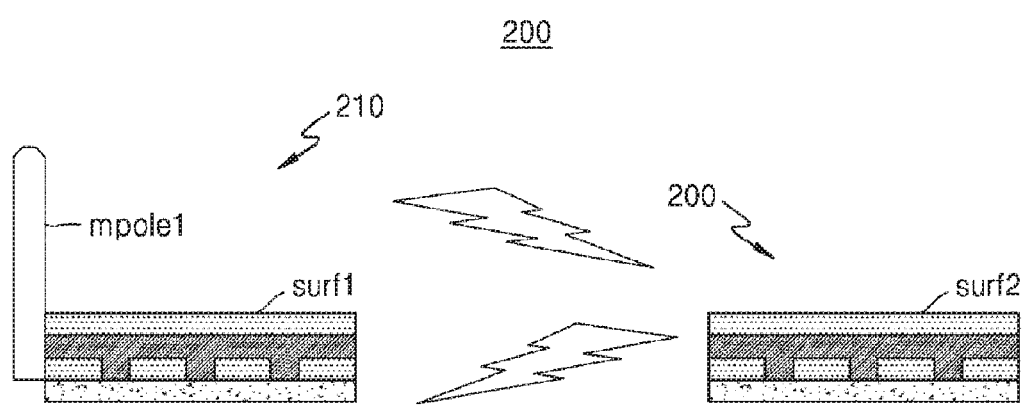
Figure 7:
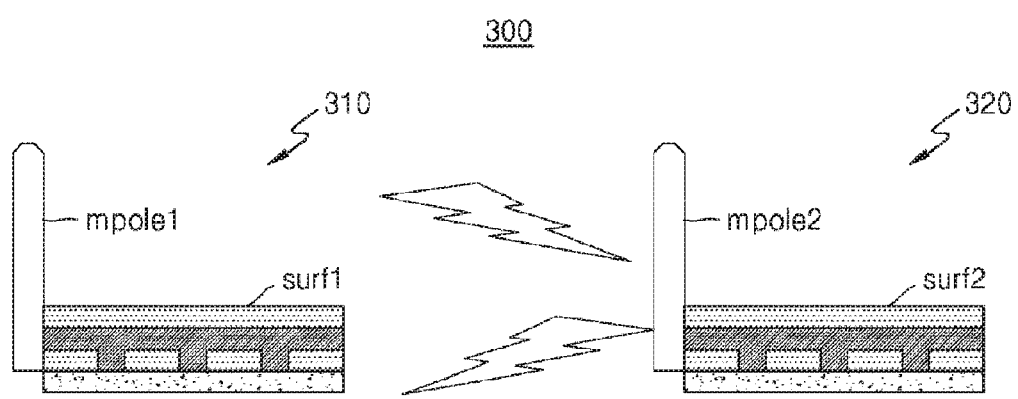

FIGS. 5 through 7 are diagrams illustrating examples of configurations of a transmitter and a receiver of a wireless power transmission and communication system according to an example embodiment. Referring to FIG. 5, a wireless power transmission and communication system 100 includes a transmitter 110 and a receiver 120. The transmitter 110 includes a first surface wave antenna (indicated as "surf1" in the drawing) installed on a metal wall and configured to transmit an evanescent electromagnetic wave flowing along a surface of the metal wall, and a first monopole antenna (indicated as "mpole1" in the drawing) connected to the first surface wave antenna in parallel. The receiver 120 includes a second monopole antenna (indicated as "mpole2" in the drawing) configured to receive an electromagnetic wave transmitted from the transmitter 110.

As described above with reference to FIG. 1, in a case in which a transmitter, for example, the transmitter 110 including the first surface wave antenna and the first monopole antenna, is installed in a cabin in a ship, a crew member present in another cabin in the ship may communicate with a crew member present in the cabin in which the transmitter 110 is installed, using the receiver 120 including the second monopole antenna as illustrated in FIG. 5.

Herein, it may be understood that an electromagnetic wave output from the first monopole antenna is received by the second monopole antenna, and it may also be understood that an evanescent electromagnetic wave output from the first surface wave antenna may be radiated to the air from a curve while flowing along the metal wall and the second monopole antenna may receive such an electromagnetic wave.

Herein, functions of the transmitter 110 and the receiver 120 may not be limited to transmitting and receiving power and/or signals, and they may perform bidirectional communication. That is, an electromagnetic wave output from the second monopole antenna may be received by the first monopole antenna and/or the first surface wave antenna.

Referring to FIG. 6, a wireless power transmission and communication system 200 includes a transmitter 210 and a receiver 220, similar to the wireless power transmission and communication system 100 described above with reference to FIG. 5. Similar to the transmitter 110 described above with reference to FIG. 5, the transmitter 210 includes a first surface wave antenna (indicated as "surf1" in the drawing) and a first monopole antenna (indicated as "mpole1" in the drawing). The receiver 220 includes a second surface wave antenna (indicated as "surf2" in the drawing). An electromagnetic wave output from the first surface wave antenna and/or the first monopole antenna may be transmitted through a metal wall and/or air, and the second surface wave antenna included in the receiver 220 may receive the electromagnetic wave.

As described above with reference to FIGS. 1 through 4, an evanescent electromagnetic wave generated in the first surface wave antenna and flowing along the metal wall may be received by the second surface wave antenna included in the receiver 220. In addition, an evanescent electromagnetic wave generated in the first monopole antenna and transmitted through air may also be received by the second surface wave antenna. Herein, functions of the transmitter 210 and the receiver 220 illustrated in FIG. 6 may not be limited to transmitting and receiving power and/or signals, but they may perform bidirectional communication. That is, an electromagnetic wave output from the second surface wave antenna may be received by the first monopole antenna and/or the first surface wave antenna.

Referring to FIG. 7, a wireless power transmission and communication system 300 includes a transmitter 310 and a receiver 320, similar to the wireless power transmission and communication system 100 described above with reference to FIG. 5. Similar to the transmitter 110 described above with reference to FIG. 5, the transmitter 310 includes a first surface wave antenna (indicated as "surf1" in the drawing) and a first monopole antenna (indicated as "mpole1" in the drawing). The receiver 320 includes a second surface wave antenna (indicated as "surf2" in the drawing) and a second monopole antenna (indicated as "mpole2" in the drawing). An electromagnetic wave output from the first surface wave antenna and/or the first monopole antenna may be transmitted through a metal wall and/or air, and the second surface wave antenna and the second monopole antenna included in the receiver 320 may receive the electromagnetic wave.

As described above with reference to FIGS. 1 through 4, an evanescent electromagnetic wave generated in the first surface wave antenna and flowing along the metal wall may be received by the second surface wave antenna included in the receiver 320. In addition, an electromagnetic wave generated in the first monopole antenna and transmitted through air may be received by the second monopole antenna. Herein, functions of the transmitter 310 and the receiver 320 illustrated in FIG. 7 may not be limited to transmitting and receiving power and/or signals, but they may perform bidirectional communication. That is, an electromagnetic wave output from the second surface wave antenna and the second monopole antenna may be received by the first monopole antenna and the first surface wave antenna.

Figure 8:
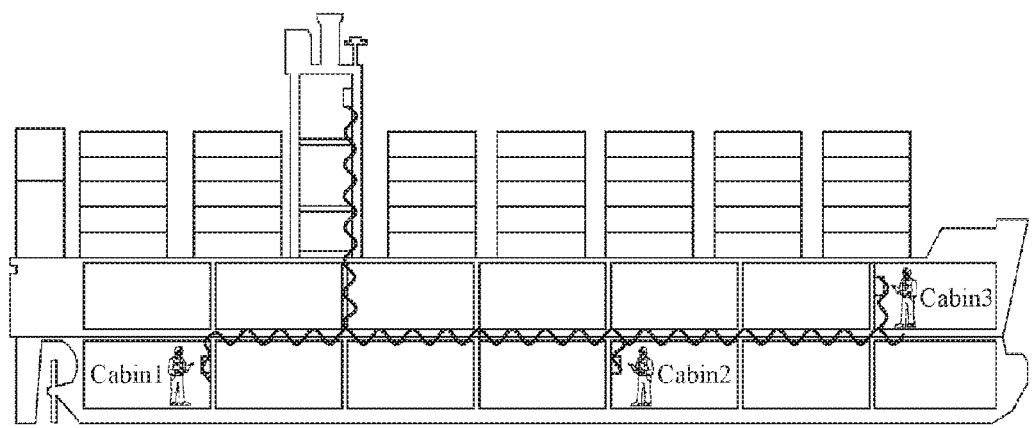
FIG. 8 is a diagram illustrating an example of a location at which a repeater is installed according to an example embodiment.

FIG. 8 is a diagram illustrating an example of a location at which a repeater is installed according to an example embodiment. According to another example embodiment, a wireless power transmission and communication system may further include a repeater configured to perform relaying between a transmitter and a receiver of the wireless power transmission and communication system. The repeater may include a third surface wave antenna configured to transmit and receive an evanescent electromagnetic wave flowing along a surface of a metal wall, and a third monopole antenna connected to the third surface wave antenna in parallel.

In a case in which the wireless power transmission and communication system is applied to a large ship, the greater the distance between the transmitter and the receiver, the lower the power and/or electromagnetic wave transmission efficiency. To prevent this, the repeater may relay power and/or electromagnetic waves between the transmitter and the receiver. For example, when a power and/or electromagnetic wave transmission efficiency decreases due to an increase in a distance between cabin 1 and cabin 3 as illustrated in FIG. 8, the repeater may be installed in cabin 2. In this example, the repeater may relay power and/or electromagnetic waves transmitted from cabin 1 to cabin 3, or relay power and/or electromagnetic waves transmitted from cabin 3 to cabin 1.

Figure 9:
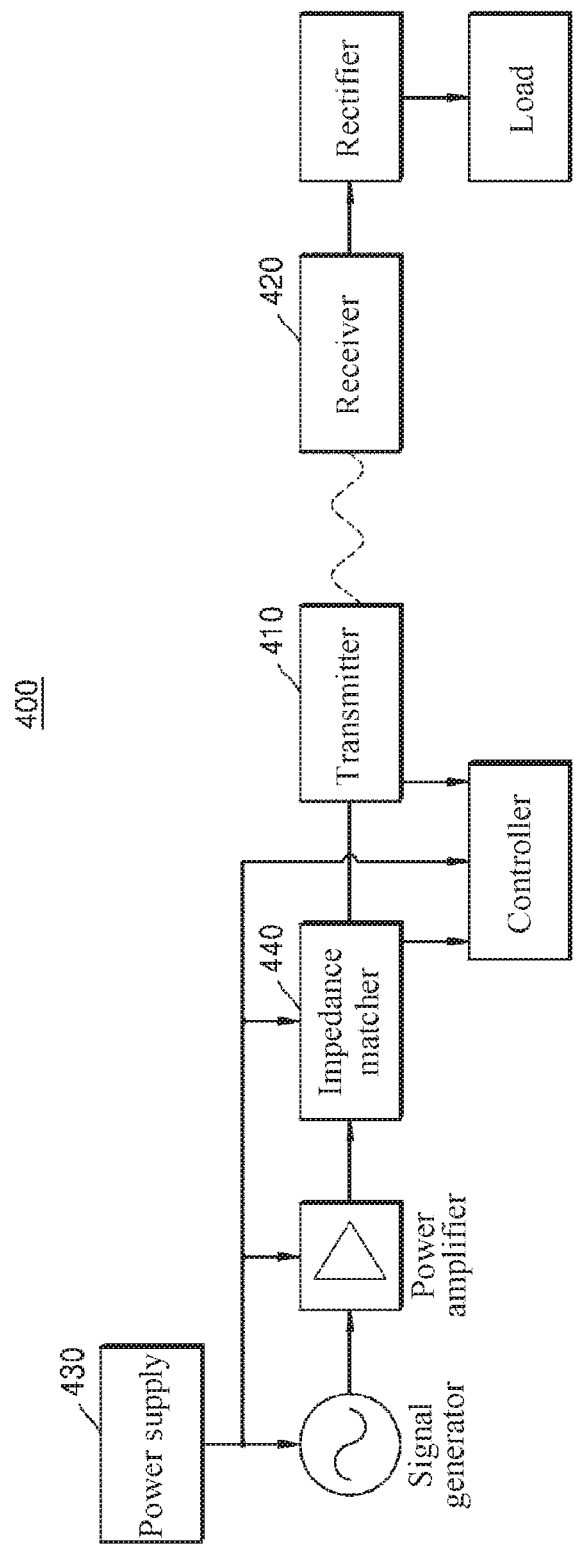
FIG. 9 is a diagram illustrating another example of a configuration of a wireless power transmission and communication system according to an example embodiment.

FIG. 9 is a diagram illustrating another example of a configuration of a wireless power transmission and communication system according to an example embodiment. Referring to FIG. 9, a wireless power transmission and communication system 400 further includes a power supply 430 and an impedance matcher 440. The power supply 430 may supply power to a transmitter 410. The impedance matcher 440 may measure a voltage reflected from the transmitter 410 and compare a magnitude of the measured voltage to a reference voltage, and perform impedance matching based on a result of the comparing.

In addition, the power supply 430 may supply, to the transmitter 410, a voltage obtained through the impedance matching. By supplying the voltage obtained through the impedance matching to the transmitter 410, the wireless power transmission and communication system 400 may improve a power and/or electromagnetic wave transmission efficiency and provide available maximum power.

The power supply 430 may operate in one of a general mode and a fast mode. A magnitude of power to be supplied to the transmitter 410 in the fast mode may be controlled to be greater than a magnitude of power to be supplied to the transmitter 410 in the general mode.

In a case in which power is transmitted through the wireless power transmission and communication system 400, the power may be received by the receiver 420 and the received power may be supplied to a load through a rectifier.

In a case in which a great amount of power needs to be supplied to the load in a short period of time, the power supply 430 may operate in the fast mode. In this case, a magnitude of power to be supplied to the transmitter 410 in the fast mode may be controlled to be greater than a magnitude of power to be supplied to the transmitter 410 in the general mode.

The power supply 430 may set a magnitude of power to be supplied to the transmitter 410 to be great in proportion to the number of devices receiving power and/or electromagnetic waves from the transmitter 410.

Figure 10:
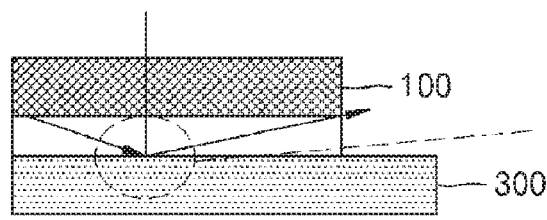
FIG. 10 is a diagram illustrating an example of a concept of power or data transmission of a wireless power transmission and communication system according to an example embodiment.
Figure 10:
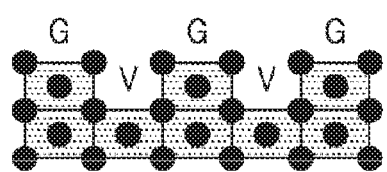
Figure 10:
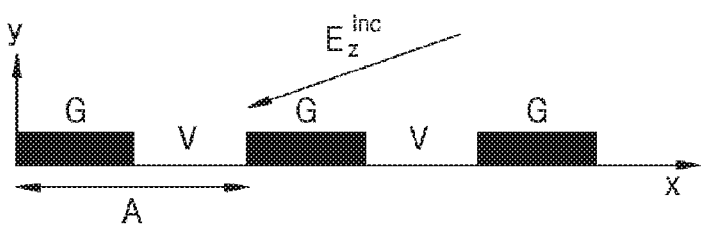

FIG. 10 is a diagram illustrating an example of a concept of power or data transmission of a wireless power transmission and communication system according to an example embodiment. Referring to FIG. 10, a metal wall may be provided in a body-centered cubic (BCC) crystal structure, or a body centric cuboid crystal structure as illustrated, or in a concavo-convex structure, that includes a convex portion, for example, a grain portion (illustrated as "G" in the drawing), and a concave portion, for example, a void portion (illustrated as "V" in the drawing), with a preset period A.

A surface wave may be generated due to an interaction between an evanescent electromagnetic wave and the metal wall, and the evanescent electromagnetic wave may flow along a surface of the metal wall. That is, an evanescent electromagnetic wave generated in a transmitter which is an evanescent electromagnetic (indicated as "EM" in the drawing) wave source may be totally reflected by the convex portion (G) and the concave portion (V) formed based on the period (A) and thereby flow along the surface. Thus, the evanescent electromagnetic wave flowing along the metal wall on which the transmitter is provided may be received through a receiver installed on the metal wall.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. A wireless power transmission and communication system, comprising:
    a transmitter comprising a first surface wave antenna installed on a metal wall and configured to transmit and receive an evanescent electromagnetic wave flowing along a surface of the metal wall, and a first monopole antenna connected to the first surface wave antenna in parallel; and
    a receiver comprising at least one of a second surface wave antenna or a second monopole antenna, which is installed in a space partitioned by the metal wall and configured to receive an evanescent electromagnetic wave flowing along the surface of the metal wall.

2. The wireless power transmission and communication system of claim 1, further comprising:
    a repeater configured to perform relaying between the transmitter and the receiver,
        wherein the repeater comprises a third surface wave antenna configured to transmit and receive an evanescent electromagnetic wave flowing along the surface of the metal wall, and a third monopole antenna connected to the third surface wave antenna in parallel.

3. The wireless power transmission and communication system of claim 1, wherein the evanescent electromagnetic wave is totally reflected by a convex portion and a concave portion formed on the metal wall on a periodic basis and thereby flows along the surface of the metal wall.

4. The wireless power transmission and communication system of claim 1, wherein each of the first surface wave antenna and the second surface wave antenna comprises:
    an upper layer provided as a rectangular waveguide of a thin film and having a plurality of perforated rectangular holes therein forming a net shape;
    a middle layer formed as a dielectric layer under the upper layer with a same thickness as that of the upper layer; and
    a lower layer formed under the middle layer with a same length, width, and thickness as those of the upper layer, and configured to perform a grounding function.

5. The wireless power transmission and communication system of claim 1, further comprising:
    a power supply configured to supply power to the transmitter; and
    an impedance matcher,
        wherein the impedance matcher is configured to measure a voltage reflected from the transmitter and compare a magnitude of the measured voltage to a reference voltage, and perform impedance matching based on a result of the comparing, and
        the power supply is configured to supply, to the transmitter, a voltage obtained through the impedance matching.

6. The wireless power transmission and communication system of claim 5, wherein the power supply is configured to operate in one of a general mode and a fast mode,
    wherein a magnitude of power to be supplied to the transmitter in the fast mode is greater than a magnitude of power to be supplied to the transmitter in the general mode.

* * * * *